(12) United States Patent
Hillman et al.

(10) Patent No.: US 7,838,418 B2
(45) Date of Patent: Nov. 23, 2010

(54) SPRAY DISPENSING METHOD FOR APPLYING LIQUID METAL

(75) Inventors: Michael D. Hillman, Los Altos, CA (US); Gregory L. Tice, Los Altos, CA (US); Oscar Woo, Santa Cruz, CA (US); Amir Salehi, San Jose, CA (US); Richard Lidio Blanco, Jr., Santa Clara, CA (US); Ronald J. Smith, New Berlin, WI (US); Sean A. Bailey, Menlo Park, CA (US); Anwyl M. McDonald, Oakland, CA (US); Clayton R. Anderson, El Cerrito, CA (US); James M. Crowder, Greenwich, NY (US); Jeffrey J. Van Norden, Clifton Park, NY (US); Jonathan N. Urquhart, Saratoga Springs, NY (US)

(73) Assignee: Apple Inc., Cupertino, CA (US)

( * ) Notice: Subject to any disclaimer, the term of this patent is extended or adjusted under 35 U.S.C. 154(b) by 75 days.

(21) Appl. No.: 11/954,158

(22) Filed: Dec. 11, 2007

(65) Prior Publication Data

US 2009/0149021 A1 Jun. 11, 2009

(51) Int. Cl.
*H01L 21/44* (2006.01)

(52) U.S. Cl. .............. 438/654; 438/121; 438/122; 257/E21.476

(58) Field of Classification Search ......... 438/121–122, 438/654; 257/E21.476
See application file for complete search history.

(56) References Cited

U.S. PATENT DOCUMENTS

| | | | | |
|---|---|---|---|---|
| 5,170,930 A | * | 12/1992 | Dolbear et al. | 228/123.1 |
| 6,060,117 A | * | 5/2000 | Pergande et al. | 427/224 |
| 6,504,242 B1 | * | 1/2003 | Deppisch et al. | 257/707 |
| 6,523,757 B1 | | 2/2003 | Bievenue et al. | |

* cited by examiner

*Primary Examiner*—Thanh Nguyen
(74) *Attorney, Agent, or Firm*—Park, Vaughan, Fleming & Dowler LLP

(57) ABSTRACT

Embodiments of a method for applying a thermal-interface material are described. During this method, a first surface of a heat-removal device and a second surface of a semiconductor die are prepared. Next, a region on a given surface, which is at least one of the first surface and the second surface, is defined. Then, the thermal-interface material is applied to at least the region, where the thermal-interface material includes a material that is a liquid metal over a range of operating temperatures of the semiconductor die.

23 Claims, 6 Drawing Sheets

DEPOSIT A FIRST LAYER ON A HEAT-REMOVAL DEVICE AND DEPOSIT A SECOND LAYER HAVING A SURFACE ON THE FIRST LAYER, WHERE THE FIRST LAYER IS SUBSTANTIALLY INSOLUBLE IN A THERMAL-INTERFACE MATERIAL AND THE SECOND LAYER WETS WITH THE THERMAL-INTERFACE MATERIAL
510

DEPOSIT A THIRD LAYER ON A SEMICONDUCTOR DIE AND DEPOSIT A FOURTH LAYER HAVING ANOTHER SURFACE ON THE THIRD LAYER, WHERE THE THIRD LAYER IS SUBSTANTIALLY INSOLUBLE IN THE THERMAL-INTERFACE MATERIAL AND THE FOURTH LAYER WETS WITH THE THERMAL-INTERFACE MATERIAL
512

ADHERE A CONTACT MASK ONTO A GIVEN SURFACE TO DEFINE A REGION, WHERE THE GIVEN SURFACE CAN BE AT LEAST ONE OF THE SURFACE AND THE OTHER SURFACE
514

APPLY A THERMAL-INTERFACE MATERIAL TO AT LEAST THE REGION, WHERE THE THERMAL-INTERFACE MATERIAL INCLUDES A MATERIAL THAT IS A LIQUID METAL OVER A RANGE OF OPERATING TEMPERATURES OF THE SEMICONDUCTOR DIE
516

FIG. 5

SPRAY DISPENSING METHOD FOR APPLYING LIQUID METAL

BACKGROUND

1. Field of the Invention

The present invention relates to techniques for applying heat-transfer materials. More specifically, the present invention relates to a system and method for applying a liquid-metal thermal-interface material.

2. Related Art

The functionality, performance, and operating speed of integrated circuits (ICs) have increased significantly in recent years. This has resulted in significantly increased power consumption and associated heat generation in these devices. Consequently, it is becoming a considerable challenge to maintain acceptable internal and external operating temperatures in these ICs.

One approach to managing the increasing thermal load is to use an improved thermal-interface material between a semiconductor die in an IC and an external environment (such as the IC package). Proper operation of the semiconductor die over a range of operating conditions determines several required properties for a candidate thermal-interface material. In particular, the thermal-interface material should not contain impurities and should not damage the semiconductor die. Moreover, the thermal-interface material should have a high bulk thermal conductivity and should conform to a surface of the semiconductor die at ambient or low pressure, thereby ensuring a low thermal impedance between the external environment and the semiconductor die.

Several liquid metals are promising candidates as improved thermal-interface materials. In principle, these liquid metals can meet the required properties, if the liquid metals are dispensed in a controlled manner. However, it is often difficult to work with liquid metals. For example, liquid metals do not wet with many materials. Consequently, it may be difficult to fabricate a thin layer of liquid metal that conforms to the surface of the semiconductor die. Moreover, many liquid metals are highly corrosive and/or dissolve other metals, which makes them extremely difficult to handle during manufacturing. This can increase the complexity and the cost of the manufacturing processes, which are obstacles to the use of these improved thermal-interface materials.

Hence what is needed are techniques for applying liquid metals without the problems listed above.

SUMMARY

One embodiment of the present invention provides a method for applying a thermal-interface material. During this method, a first surface of a heat-removal device and a second surface of a semiconductor die are prepared. Next, a region on a given surface, which is at least one of the first surface and the second surface, is defined. Then, the thermal-interface material is applied to at least the region, where the thermal-interface material includes a material that is a liquid metal over a range of operating temperatures of the semiconductor die.

In some embodiments, preparation of the first surface and the second surface includes depositing a first layer which is substantially insoluble in the thermal-interface material on the first surface and the second surface. For example, the first layer may include titanium. Moreover, preparation of the first surface and the second surface may include depositing a second layer which wets with the thermal-interface material on the first layer. This second layer may include gold.

In some embodiments, preparation of the first surface and the second surface includes depositing a third layer between the first layer and the second layer. This third layer may include an inter-metallic compound.

In some embodiments, preparation of the first surface and the second surface includes adhering a film to the first surface and the second surface. This film may include the first layer, where the first layer is substantially insoluble in the thermal-interface material. Moreover, the film may include the second layer above the first layer, where the second layer wets with the thermal-interface material.

In some embodiments, the semiconductor die includes a processor.

In some embodiments, defining the region includes adhering a contact mask onto the given surface.

In some embodiments, the heat-removal device and the semiconductor die are attached to one or more carriers before the first surface and the second surface are prepared.

In some embodiments, the thermal-interface material has approximately a uniform thickness in the region. For example, the thickness may be between 1 and 150 µm at atmospheric pressure.

In some embodiments, the thermal-interface material includes a gallium-indium-tin alloy. For example, the gallium-indium-tin alloy may include between 55-75% gallium, 15-25% indium, and 5-20% tin.

In some embodiments, the thermal-interface material is confined to the region.

In some embodiments, application of the thermal-interface material includes spray coating.

In some embodiments, the liquid metal has a bulk thermal conductivity between 7 and 100 W/mK. Moreover, the liquid metal may have a melting temperature below room temperature.

In some embodiments, another region is defined on another surface, which is the other of the first surface and the second surface. Then, the thermal-interface material is applied to the other region.

Another embodiment provides a method for applying a thermal-interface material. During this method, a first layer is deposited on a heat-removal device and a second layer having a surface is deposited on the first layer, where the first layer is substantially insoluble in a thermal-interface material and the second layer wets with the thermal-interface material. Next, a third layer is deposited on a semiconductor die and a fourth layer having another surface is deposited on the third layer, where the third layer is substantially insoluble in the thermal-interface material and the fourth layer wets with the thermal-interface material. Then, a contact mask is adhered onto a given surface to define a region, where the given surface can be at least one of the surface and the other surface. Moreover, the thermal-interface material is applied to at least the region, where the thermal-interface material includes a material that is a liquid metal over a range of operating temperatures of the semiconductor die.

BRIEF DESCRIPTION OF THE FIGURES

FIG. 5 is a flow chart illustrating a process for applying a thermal-interface material in accordance with an embodiment of the present invention.

Note that like reference numerals refer to corresponding parts throughout the drawings.

DETAILED DESCRIPTION

Figure 1:
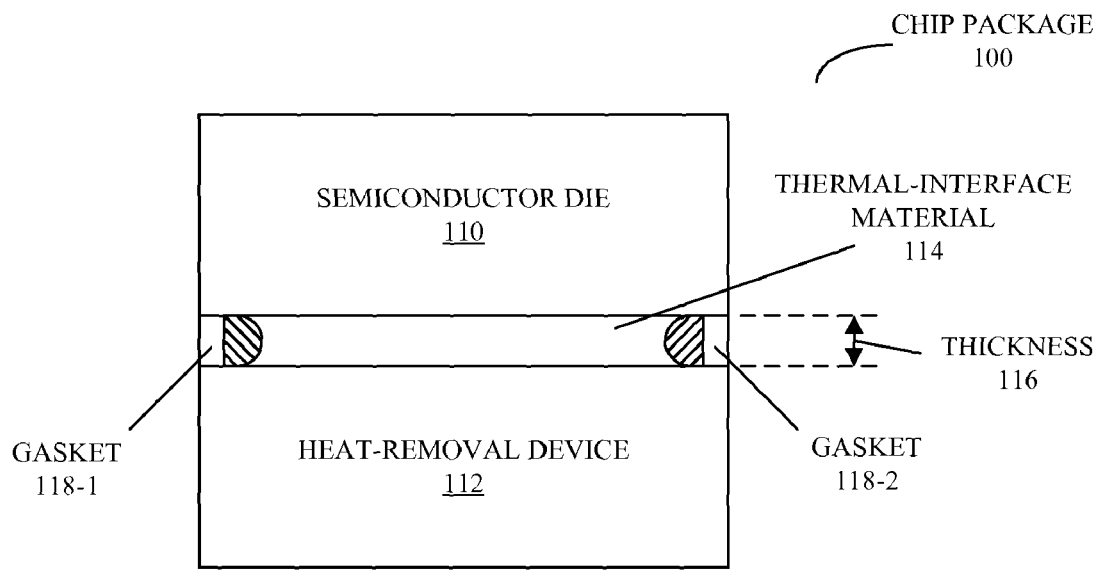
FIG. 1 is a block diagram illustrating a chip package in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of an apparatus and a process for applying a thermal-interface material are described. This apparatus, which may include manufacturing or fabrication equipment, is configured to perform at least some of the operations in the process. During the process, surfaces on one or more components, such as a heat-removal device and/or one or more semiconductor dies, are prepared, for example, by depositing one or more layers and/or by adhering one or more films to these surfaces. These layers and/or films include materials that are compatible with the thermal-interface material. In particular, the materials have properties that prevent the thermal-interface material from damaging the components and which facilitate a low thermal boundary impedance between the thermal-interface material and a given surface. For example, one of the materials may be substantially insoluble in the thermal-interface material and another of the materials may wet the thermal-interface material.

Next, one or more regions may be defined on one or more of the surfaces, for example, by adhering a mask (such as a contact mask) onto the given surface. Then, the thermal-interface material may be applied, for example, by using a spray-coating technique.

Note that the one or more semiconductor dies may include a processor, and the heat-removal device may include: a heat sink (which may be made of a metal such as copper), a Peltier device, a liquid-cooled cold plate, and/or a thermal reservoir. Moreover, the thermal interface may include a metal in a liquid state (or more generally, a metal alloy) as a thermal-interface material. This metal or metal alloy (henceforth referred to as a liquid metal) may have a low melting point (such as below room temperature or 25 C). More generally, the liquid metal has a melting point which is below an operating temperature of the semiconductor die.

In an exemplary embodiment, the liquid metal includes gallium, indium, and tin. Note that the liquid metal may also include elements other than metals, such as diamond or graphite.

In the discussion that follows, a semiconductor die is understood to include: a bare die, a packaged die, multiple dies, and/or two or more dies in a single package (which is sometimes referred to as a multi-chip module).

By using a liquid metal as the thermal-interface material, there may be an improved thermal coupling between the heat-removal device and the one or more semiconductor dies. In particular, the liquid metal may facilitate a low thermal impedance between the one or more semiconductor dies and the heat-removal device. In an exemplary embodiment, the liquid metal has a bulk thermal conductivity between 7 and 100 W/mK. Furthermore, the thermal impedance may be low even when the semiconductor dies have different thicknesses or if surfaces of two semiconductor dies that are in contact with the liquid metal are in different planes.

This improved thermal coupling may facilitate operation of the semiconductor die at elevated temperatures and/or high power. Moreover, the liquid metal may facilitate improved thermal coupling at ambient or at low pressures (i.e., pressures below atmospheric pressure), thereby simplifying and reducing the cost of a chip package that includes the one or more semiconductor dies. In some embodiments, the liquid metal does not form a permanent bond with the one or more semiconductor dies, thus allowing the chip package to be reworked.

Consequently, the apparatus and the process described below facilitate the use of liquid metal as the thermal-interface material, and thus, the operation of the one or more semiconductor dies at high thermal loads. Moreover, by using the apparatus and/or the process, the liquid metal can be dispensed in a controlled manner, without damaging the components, and without increasing the complexity and/or the cost associated with manufacturing the chip package.

We now describe embodiments of an apparatus that includes a thermal-interface material. FIG. 1 presents a block diagram illustrating an embodiment of a chip package 100. This chip package includes at least one semiconductor die, such as semiconductor die 110, and a heat-removal device 112. During operation of the chip package 100, heat is generated by electrical circuits and/or components on the semiconductor die 110. To improve the thermal coupling between the heat-removal device 112 and the semiconductor die 110 (and thus, to improve the transport of heat from the semiconductor die 110 to the heat-removal device 112) a thermal interface including a thermal-interface material 114 having a thickness 116 may be included between a surface of the semiconductor die 110 and a surface of the heat-removal device 112. In an exemplary embodiment, the thickness 116 is between 1-150 µm at atmospheric pressure or at a contact pressure of 5 psi.

As noted previously and discussed further below, the thermal-interface material 114 may be a liquid (i.e., a material without shear strength) at room temperature and/or an operating temperature (such as 80, 100, or 125 C) of the semiconductor die 110. Consequently, a gasket 118 may be mechanically coupled and/or chemically coupled to the semiconductor die 110 and the heat-removal device 112 in the chip package 100, both to contain the liquid thermal-interface material 114 and to protect it from contamination. Note that there may be a void (indicated by the hatched region) between the thermal-interface material 114 and the gasket 118.

In principle, a wide variety of thermal-interface materials may be used to provide the thermal interface. However, many existing thermal-interface materials have melting points above room temperature. Note that existing thermal-interface materials include: conventional heat-sink grease (such as silicone-based grease), thermally conductive pads, phase-change materials (such as wax-based materials), heat-transfer fluids (such as ethylene glycol or propylene glycol), water, or thermally conductive solders (such as commercially pure indium). As discussed below, low-melting point metal alloys (such as a liquid metal that has a melting-point below room temperature or 25 C) have superior physical properties that may facilitate improved operation of the one or more semiconductor dies.

In particular, the physical properties of these metal alloys enable them to conform to the surfaces of the one or more semiconductor dies, even if the semiconductor dies have different thicknesses and/or have surfaces that are not coplanar. Consequently, thermal boundary resistances associated with low-melting point metal alloys may be small.

Moreover, low-melting point metal alloys have high bulk thermal conductivities, which, in conjunction with the low boundary resistances, may result in a low thermal resistance between the semiconductor die 110 and the heat-removal device 112. In turn, a low thermal resistance may reduce the sensitivity to changes in the thickness 116 of the thermal-interface material 114 (which is also referred to as a bond-line thickness). For example, the thermal-interface material 114 may have a bulk thermal conductivity between 7 and 100 W/mK and the thermal resistance of the thermal interface may be less than 0.2 K/W. Consequently, a thermal difference or gradient $\Delta T$ between the semiconductor die 110 and the heat-removal device 112 may be significantly reduced or eliminated relative to the thermal gradient associated with other thermal-interface materials. Furthermore, because the metal alloys are already liquid at the operating temperatures of the one or more semiconductor dies, the thermal-interface material 114 will not be near a critical thermal breakdown temperature.

In some embodiments, the liquid metal is configured such that a permanent chemical bond does not occur with the semiconductor die 110 and/or the heat-removal device 112. This property facilitates easier cleaning of these components (for example, using a vacuum, a mechanical wipe, and/or a cleaning agent, such as acetone and/or isopropyl alcohol) and/or rework of the chip package 100.

In some embodiments, the thermal-interface material 114 in the thermal interfaces includes: bismuth, lead, zinc, sliver, gold, tin, chromium, nickel, aluminum, palladium, platinum, tantalum, gallium, indium, and/or titanium. For example, the thermal-interface material 114 may include metallic particles of one or more of the preceding materials. In some embodiments, the thermal-interface material 114 is an alloy that includes 1,2, 3, or more metal elements. In some embodiments, the thermal-interface material 114 is a eutectic material. Moreover, in some embodiments the liquid metal may be doped with other materials, such as diamond and/or graphite. These materials may increase or enhance interfacial adhesion between the liquid metal and the semiconductor die 110 and the heat-removal device 112. In general, the liquid metal may include a variety of organic and/or inorganic compounds.

In an exemplary embodiment, the liquid metal is an alloy that includes gallium, indium, and tin (or a similar density liquid metal). This alloy can be formulated in a variety of compositions, including eutectic gallium-indium-tin alloy (62.5% gallium, 21.5% indium, and 16.0% tin) with a melting point of 10.7 C and Galinstan™ (68.5% gallium, 21.5% indium, and 10.0% tin) with a melting point of around 22 C. In some embodiments, the gallium-indium-tin alloy includes between 55-75% gallium, 15-25% indium, and 5-20% tin. In another embodiment, the thermal-interface material 114 includes 75.5% gallium and 15.7% indium, with a melting temperature of 15.7 C, or 62.5% gallium, 21.5% indium, and 10.7% tin, with a melting temperature of 10.7 C.

Note that in some embodiments chip package 100 includes fewer or additional components. Moreover, two or more components are combined into a single component, and/or a position of one or more components may be changed.

Figure 2A:
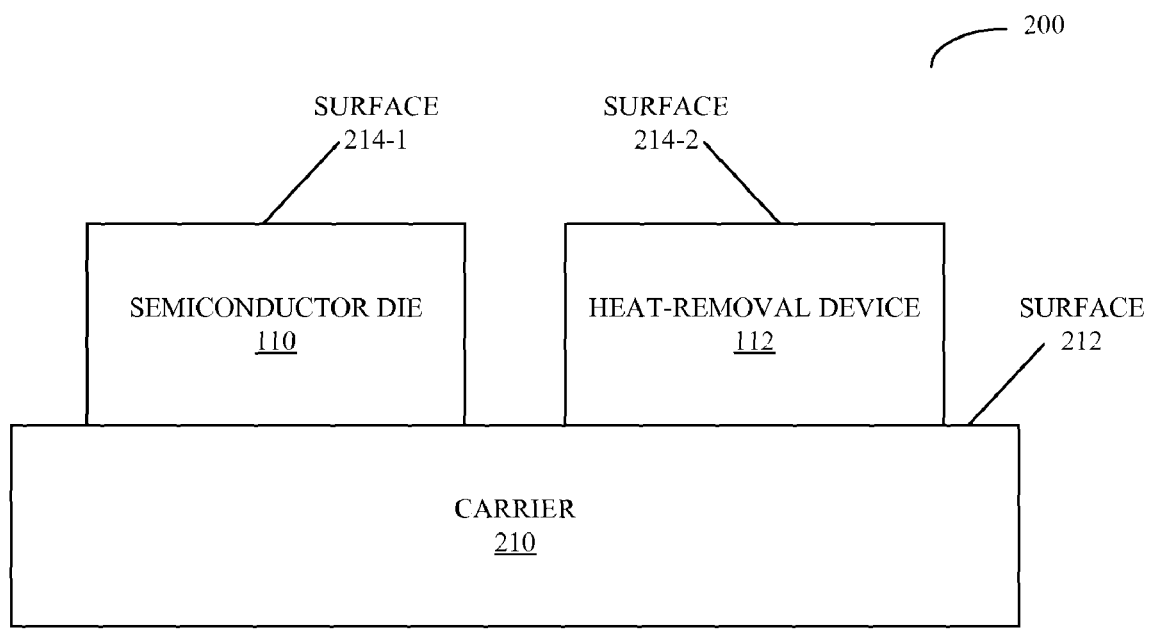
FIG. 2A is a block diagram illustrating a portion of a process for applying a thermal-interface material in accordance with an embodiment of the present invention.

We now discuss embodiments of a method for applying a thermal-interface material, such as the thermal-interface material 114, to one or more surfaces of the semiconductor die 110 and/or the heat-removal device 112. FIG. 2A presents a block diagram 200 illustrating an embodiment of a portion of a process for applying the thermal-interface material 114 (FIG. 1). During this process, one or more semiconductor dies, such as semiconductor die 110, and/or heat-removal device 112 may be attached to one or more carriers, such as carrier 210. This carrier facilitates transportation of the components during the manufacturing process and protects the components from corrosion by the thermal-interface material 114 (FIG. 1).

Moreover, the carrier 210 may allow the tooling in the remainder of the process to be common, i.e., to be used with any of the components. While not shown, the carrier 210 may include alignment features, which may be used to position one or more masks relative to the components (as discussed further below with reference to FIGS. 2B and 2C). In some embodiments, a surface 212 of the carrier 210 is coplanar with surfaces 214 of the components that will be coated with the thermal-interface material 114 (FIG. 1).

Carrier 210 may include a material that resists corrosion by the thermal-interface material 114 (FIG. 1). In some embodiments, the carrier 210 includes: stainless steel, steel, polycarbonate, and/or a chemically inert material.

In order to achieve uniform and complete coverage of the desired portions of the surfaces 214, either or both of these surfaces may be prepared by plating an initial layer onto these surfaces 214. For example, a nickel-copper layer may be plated onto the semiconductor die.

Figure 2B:
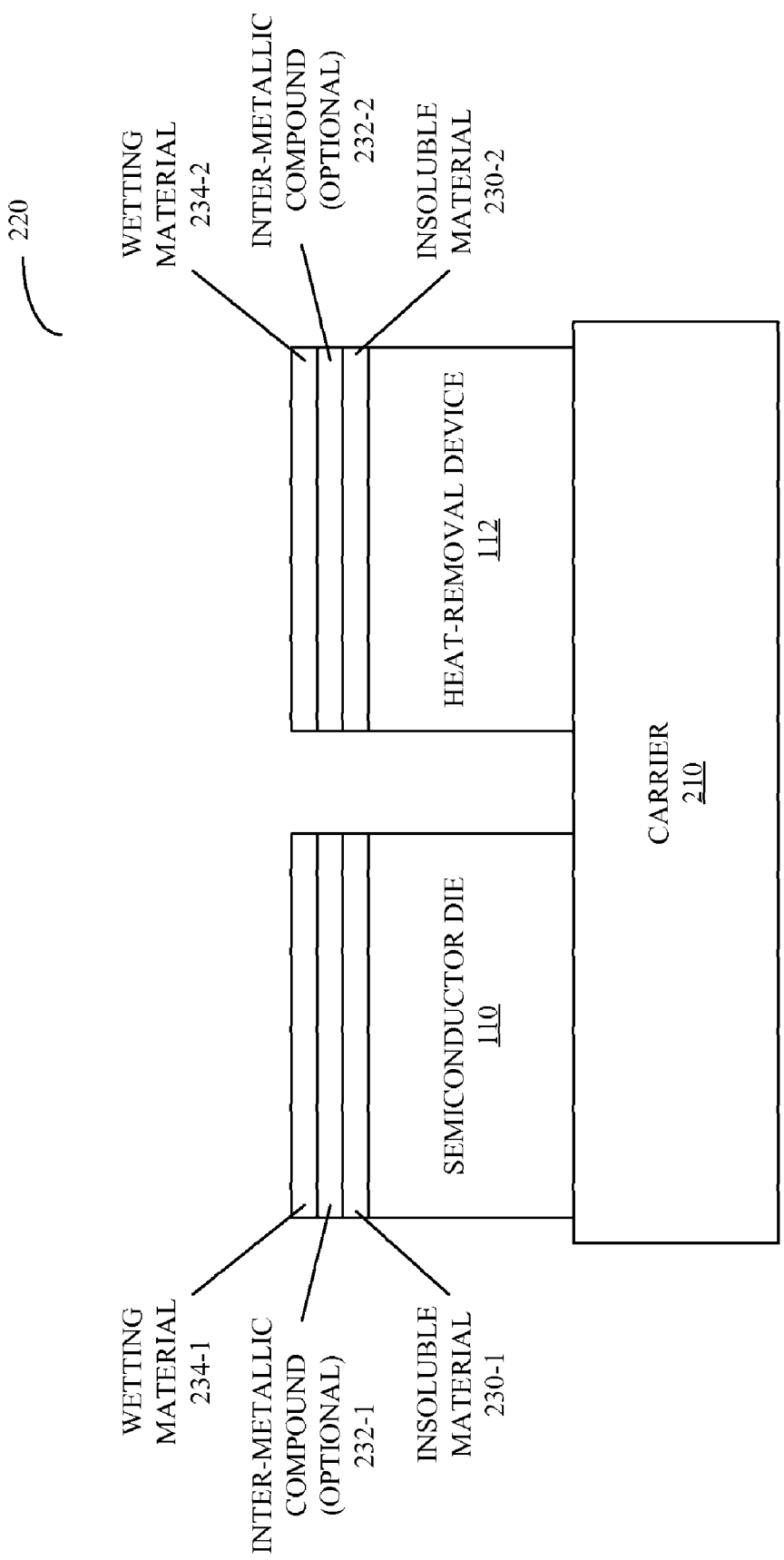
FIG. 2B is a block diagram illustrating a portion of a process for applying a thermal-interface material in accordance with an embodiment of the present invention.

Then, one or more additional layers or films may be deposited and/or adhered to either or both of the surfaces 214. This is shown in FIG. 2B, which presents a block diagram 220 illustrating an embodiment of a portion of a process for applying the thermal-interface material 114 (FIG. 1). In particular, a layer including an insoluble material 230 that will not dissolve in the presence of the thermal-interface material 114 (FIG. 1) may be deposited and another layer that includes a wetting material 234 (i.e., a material that will wet with the thermal-interface material 114 in FIG. 1) may be deposited above the layer. In some embodiments, yet another layer that includes an optional inter-metallic compound 232 may be deposited between these layers.

In general, the layers shown in block diagram 220 include a metal (or more generally, a metal alloy), such as gold, platinum, tantalum, titanium, tin, chromium, nickel, zinc, silver, and/or aluminum. Moreover, in some embodiments the layers may include an adhesion promoter, such as an RCA-1 surface preparation and/or a silated promoter.

In an exemplary embodiment, the insoluble material 230 includes titanium, the wetting material 234 includes gold, and the optional inter-metallic compound 232 includes a gold-titanium alloy. Moreover, a thickness of the layer of insoluble material 230 may be 300 nm, a thickness of the layer of wetting material 234 may be between 10-300 nm, and a thickness of the layer of optional inter-metallic compound 232 maybe less than 100 nm.

Note that a variety of techniques may be used to deposit these layers, including: plating, evaporation, and/or sputtering. Moreover, prior to this operation the underlying surface may be intentionally roughened (for example, using electromechanical polishing) to promote adhesion.

In an exemplary embodiment, deposition of the insoluble material 230, the wetting material 234, and/or the optional inter-metallic compound 232 includes sputtering. Regions on the surfaces 214 (FIG. 2A) that are to be coated may be defined using a shadow mask. This mask may have an edge tolerance of 0.5 mm.

However, in other embodiments at least some of the layers may be adhered instead of deposited onto the surfaces 214 (FIG. 2A). For example, a pre-existing titanium film on a polymer backing may be applied and adhered to the semiconductor die 110 and/or the heat-removal device 212 using epoxy or a resin cement, such as M-bond from Tokuyama America, Inc., in Burlingame, Calif. In some embodiments, these films may be carefully pressed on, for example, using a backing and low pressure.

After the one or more layers have been deposited and/or adhered to the semiconductor die 110 and/or the heat-removal device 212, the resulting surfaces may be burnished or polished to reduced roughness. Moreover, these surfaces may be cleaned using chemicals, such as acetone and/or isopropyl alcohol.

Figure 2C:
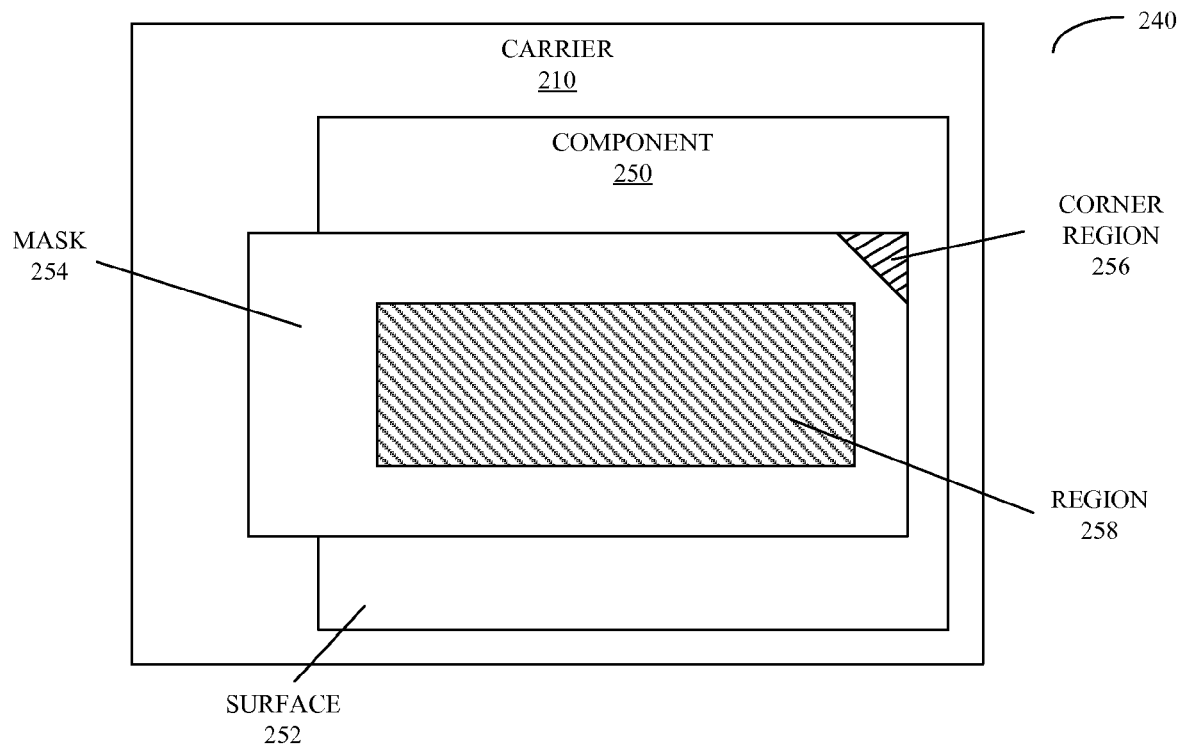
FIG. 2C is a block diagram illustrating a portion of a process for applying a thermal-interface material in accordance with an embodiment of the present invention.

Next, regions where the thermal-interface material 114 (FIG. 1) is to be applied may be defined by adhering one or more masks (such as a contact mask) onto the semiconductor die 110 and/or the heat-removal device 212. This is shown in FIG. 2C, which presents a block diagram 240 illustrating an embodiment of a portion of a process for applying the thermal-interface material 114 (FIG. 1). In particular, mask 254 may be adhered to a surface 252 of a component 250 (such as the semiconductor die 110 or the heat-removal device 212 in FIG. 2B) and/or the carrier 210, thereby creating a bridge between the component 250 and the carrier 210, which may help hold the component 250 to the carrier 210. This mask 254 may limit an area or region 258 where the thermal-interface material 114 (FIG. 1) is applied (as discussed further below with reference to FIG. 2D). As noted previously, the position of the mask 254 may, at least in part, be determined by alignment features on the carrier 210.

Figure 3:
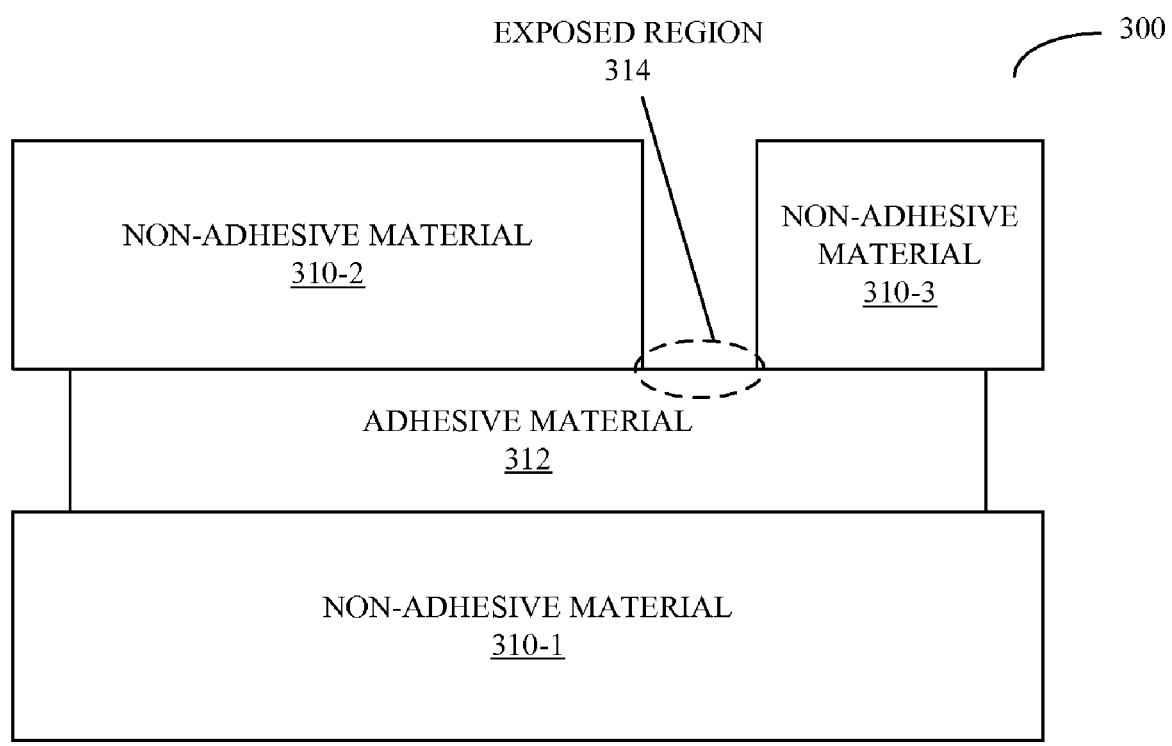
FIG. 3 is a block diagram illustrating a mask for use during a process for applying a thermal-interface material in accordance with an embodiment of the present invention.

In an exemplary embodiment, mask 254 includes a multi-layer structure. This is shown in FIG. 3, which presents a block diagram illustrating an embodiment of a mask 300 for use during a process for applying the thermal-interface material 114 (FIG. 1). This mask includes layers with non-adhesive material 310 (such as MYLAR (biaxially oriented polyethylene terephthalate polyester film) and/or paper) sandwiching an adhesive material 312 (such as a rubber-based adhesive and/or an acrylic-based adhesive). In some embodiments, the non-adhesive material 310 includes: 3M 7731FL, 3M FP024502, 3M 7113, 3M 7816, 3M 76999, 3M 7812, and/or 3M 7600 (from 3M Corporation, in St. Paul, Minn.). Alternatively, the non-adhesive material 310 may include: Bay Area Labels (BAL) 9415 A-10, BAL K22, BAL V23, BAL KX04, BAL P66, BAL P07, BAL K10-8, BAL K47, BAL P05, BAL K72-8, BAL M81-1.5, BAL P03, BAL K85, and/or BAL V86-4 (from Bay Area Labels, Inc., in San Jose, Calif.).

Adhesive material 312 may form a temporary or a permanent bond, and may have a high pull strength or a low pull strength. In general, the adhesive material 312 is chosen so that it does not leave a residue on the surface 252 (FIG. 2C) and not to disturb thermal-interface material 114 (FIG. 1) when the mask 300 is removed. Moreover, gaps may be defined in at least one of the layers in the mask 300, leaving exposed regions, such as exposed region 314. These exposed regions of adhesive may adhere to the carrier 210 (FIG. 2C) and/or the component 250 (FIG. 2C).

Figure 2D:
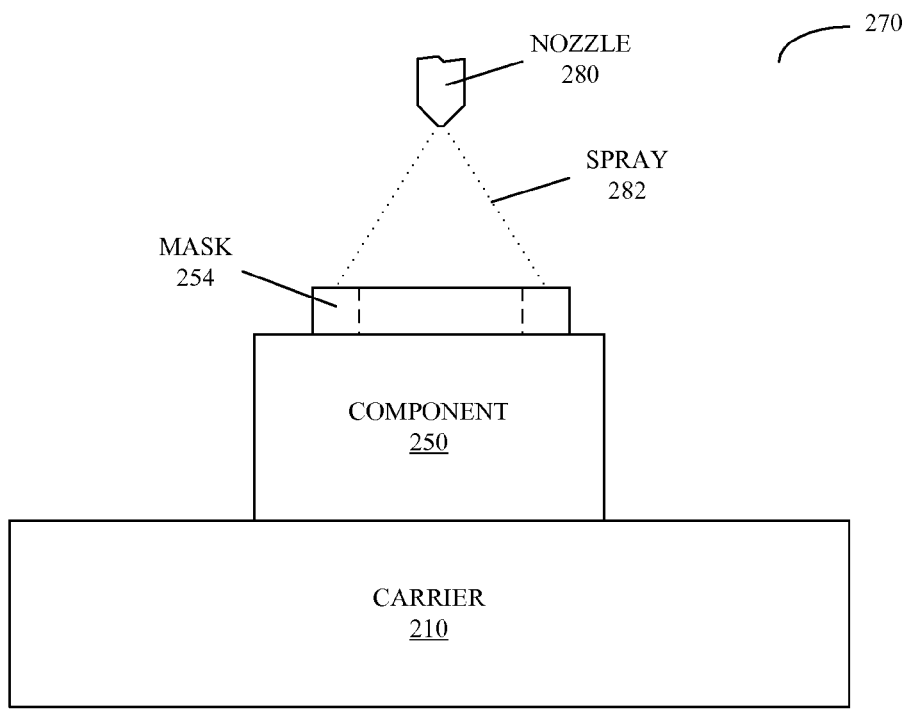
FIG. 2D is a block diagram illustrating a portion of a process for applying a thermal-interface material in accordance with an embodiment of the present invention.

Referring back to FIG. 2C, the geometry of the exposed regions may be selected so that the thermal-interface material 114 (FIG. 1) does not leak under the mask 254 and so that the thermal-interface material 114 (FIG. 1) is not moved or disturbed when the mask 254 is removed after the thermal-interface material 114 (FIG. 1) is applied (which is discussed below with reference to FIG. 2D). In some embodiments, a tamp-down fixture, such as a gasket, is used to push down on the adhesive in the exposed regions with a uniform pressure, thereby properly adhering the mask 254 to the carrier 210 and/or the component 250.

In some embodiments, a region, such as corner region 256, of the mask 254 may have more exposed regions, i.e., more adhesion between the adhesive material 312 (FIG. 3) and the component 250. This may reduce or eliminate disturbance of the thermal-interface material 114 (FIG. 1) when the mask 254 is subsequently removed.

Having prepared the surfaces 214 (FIG. 2A) and defined regions, such as region 258, the thermal-interface material 114 (FIG. 1) may be applied to the semiconductor die 110 (FIG. 2B) and/or the heat-removal device 112 (FIG. 2B). This is shown in FIG. 2D, which presents a block diagram 270 illustrating an embodiment of a portion of a process for applying the thermal-interface material 114 (FIG. 1). During this portion of the process, one or more carriers and/or components (such as the semiconductor die 110 and/or the heat-removal device 112 in FIG. 2B) may be placed into a containment box (not shown). In conjunction with the mask 254 (FIG. 2C), this containment box protects corrosion-sensitive contact pads on the components from exposure to the thermal-interface material 114 (FIG. 1). In particular, only the mask 254 (FIG. 2C) and regions, such as region 258 (FIG. 2C), are exposed, and the mask 254 (FIG. 2C) may ensure that the applied thermal-interface material 114 (FIG. 1) is confined to these regions. In an exemplary embodiment, the containment box includes stainless steel, steel, and/or nickel. Moreover, in some embodiments the containment box includes an integrated fluid recovery system (to recycle excess material) and/or replaceable gaskets.

As discussed previously, the thermal-interface material 114 (FIG. 1) applied may be a metal alloy, such as a gallium-indium-tin eutectic. Component materials in this metal alloy may have a purity of 99.99% or better. These component materials may be mixed at 150 C with a composition tolerance of 0.5%. Note that the component materials may be obtained from a variety of suppliers, including Alfa Aesar, Inc., in Ward Hill, Mass. Alternatively, the metal alloy may be purchased pre-mixed from suppliers, such as AIM Specialty Alloys, Inc., in Cranston, R.I.

In order to obtain the desired physical properties, the applied thermal-interface material 114 (FIG. 1) should be thin (with a thickness 116 in FIG. 1 between 1-150 µm), and should uniformly and completely cover the regions, such as the region 258 (FIG. 2C). Moreover, in order to reduce the manufacturing cost, the process of applying the thermal-interface material 114 (FIG. 1) should avoid waste (for example, by not applying excess material) and should offer high volume and high yield.

However, many liquid metals tend to bead on many surfaces. To avoid this, an atomization process may be used to provide energy to initiate wetting with the surfaces 214 (FIG. 2A) of the component 250. As shown in block diagram 270, nozzle 280 provides a spray 282 that spray coats the thermal-interface material 114 (FIG. 1) onto the regions (such as region 258 in FIG. 2C) defined by the mask 254. In some embodiments, a raster pattern (which includes a sequence of parallel deposition paths) is used to reduce or minimize the amount of the thermal-interface material 114 (FIG. 1) used and to obtain a uniform coverage.

During application of the thermal-interface material 114 (FIG. 1), the thermal-interface material 114 (FIG. 1) may be injected into a deposition chamber through an extended spray valve using a cartridge and a pressure between 8-12 psi. This cartridge may have a threaded connector to couple to the deposition chamber and may include a dual plunger to prevent leakage. In some embodiments, the cartridge includes a material resistant to corrosion, such as high-density polyethylene, stainless steel, and/or nickel. Moreover, the spray valve may utilize a design described in U.S. Pat. No. 6,523,757, entitled "Compact Spray Valve," the contents of which are hereby incorporated by reference.

As the thermal-interface material 114 (FIG. 1) is pushed through the spray valve, a sequence of bubbles are formed. An atomizing gas strikes these bubbles, blowing them apart and atomizing the thermal-interface material 114 (FIG. 1) and producing the spray 282. In an exemplary embodiment, the nozzle 280 is 8-10 mm from the component 250 and the cartridge and spray valve are heated to 35-40 C. Moreover, the atomizing gas may be nitrogen with a pressure between 10-13 psi, the raster speed may be between 100-200 mm/s, and the deposition rate may be 12 mg/s.

Note that the amount of material applied may be monitored to ensure proper coverage and to prevent overflow. In some embodiments, this monitoring includes visual inspection (for example, looking for pin holes and/or determining the transparency of the film) and/or weighing the applied thermal-interface material 114 (FIG. 1). In an exemplary embodiment, 50 mg of liquid metal are applied to the surface of a given component, such as the component 250.

While spray coating has been described as an illustrative example, in other embodiments other techniques may be used separately or in conjunction with spray coating, including print-head technology and/or silk screening. Moreover, a variety of techniques may be used to spread the thermal-interface material 114 (FIG. 1) and improve the uniformity of the thickness 116 (FIG. 1), including: angular acceleration (for example, by spinning the component 250), magnetic hydrodynamics (where current in the thermal-interface material 114 in FIG. 1 generates a magnetic field that propels it in the region 258 in FIG. 2C), ultrasound, and/or mechanical vibration. In some embodiments, an integrated sonicator, which floats on the thermal-interface material 114 (FIG. 1) during or after deposition, is used to improve the uniformity of the thickness 116 (FIG. 1). In other embodiments, the thermal-interface material 114 (FIG. 1) is applied as a solid, which becomes a liquid at an operating temperature of the semiconductor die 110 (FIG. 1).

Note that in some embodiments block diagrams 200 (FIG. 2A), 220 (FIG. 2B), 240 (FIG. 2C), and/or 270, as well as mask 300 (FIG. 3), include fewer or additional components. Moreover, two or more components are combined into a single component, and/or a position of one or more components may be changed.

Figure 4:
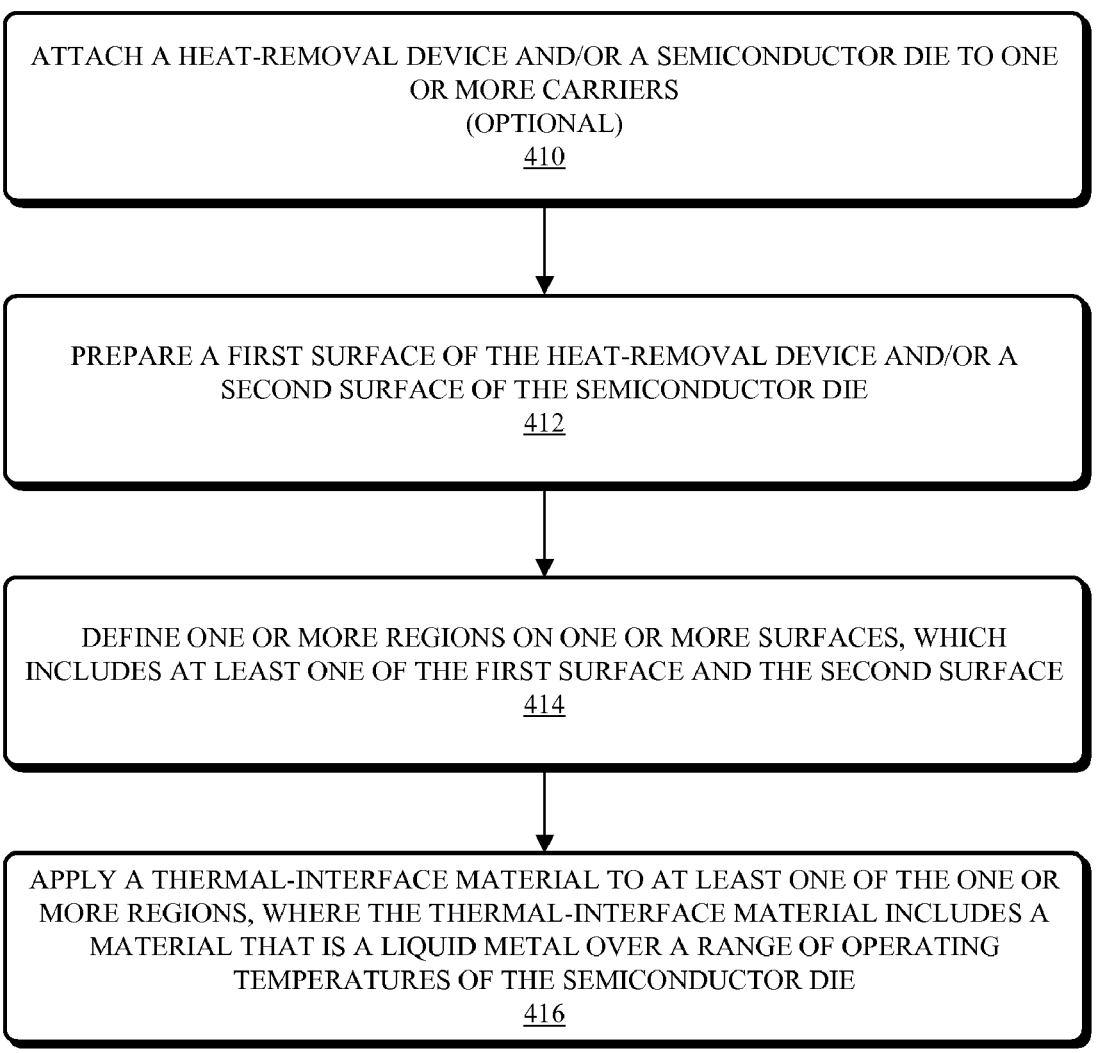
FIG. 4 is a flow chart illustrating a process for applying a thermal-interface material in accordance with an embodiment of the present invention.

FIG. 4 presents a flow chart illustrating an embodiment of a process 400 for applying a thermal-interface material. During this process, a semiconductor die and/or a heat-removal device are optionally attached to one or more carriers (410). Next, a first surface of the heat-removal device and/or a second surface of the semiconductor die are prepared (412).

Then, one or more regions on one or more surfaces, which may include at least one of the first surface and the second surface, are defined (414). Moreover, the thermal-interface material is applied to at least one of the one or more regions (416), where the thermal-interface material includes a material that is a liquid metal over a range of operating temperatures of the semiconductor die.

FIG. 5 presents a flow chart illustrating an embodiment of a process 500 for applying a thermal-interface material. During this process, a first layer is deposited on a heat-removal device and a second layer having a surface is deposited on the first layer (510), where the first layer is substantially insoluble in a thermal-interface material and the second layer wets with the thermal-interface material. Next, a third layer is deposited on a semiconductor die and a fourth layer having another surface is deposited on the third layer (512), where the third layer is substantially insoluble in the thermal-interface material and the fourth layer wets with the thermal-interface material.

Then, a contact mask is adhered onto a given surface to define a region (514), where the given surface can be at least one of the surface and the other surface. Moreover, the thermal-interface material is applied to at least the region (514), where the thermal-interface material includes a material that is a liquid metal over a range of operating temperatures of the semiconductor die.

Note that in some embodiments there may be additional or fewer operations. Moreover, the order of the operations may be changed, and two or more operations may be combined into a single operation.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for applying a thermal-interface material, comprising:
    preparing a first surface of a heat-removal device and a second surface of a semiconductor die;
    using a mask to define a region on a given surface where the thermal-interface material is to be applied, wherein the given surface is at least one of the first surface and the second surface, wherein the mask exposes the region on the given surface, and wherein the mask includes a layer of adhesive material sandwiched between layers of non-adhesive material;
    spray-coating the thermal-interface material to at least the region, wherein the thermal-interface material includes a material that is a liquid metal over a range of operating temperatures of the semiconductor die.

2. The method of claim 1, wherein preparing the first surface and the second surface includes depositing a first layer which is substantially insoluble in the thermal-interface material on the first surface and the second surface.

3. The method of claim 2, wherein the first layer includes titanium.

4. The method of claim 2, wherein preparing the first surface and the second surface includes depositing a second layer which wets with the thermal-interface material on the first layer.

5. The method of claim 4, wherein the second layer includes gold.

6. The method of claim 4, wherein preparing the first surface and the second surface includes depositing a third layer between the first layer and the second layer.

7. The method of claim 6, wherein the third layer includes an inter-metallic compound.

8. The method of claim 1, wherein preparing the first surface and the second surface includes adhering a film to the first surface and the second surface.

9. The method of claim 8, wherein the film includes a first layer, and wherein the first layer is substantially insoluble in the thermal-interface material.

10. The method of claim 9, wherein the film includes a second layer above the first layer, and wherein the second layer wets with the thermal-interface material.

11. The method of claim 1, wherein the semiconductor die includes a processor.

12. The method of claim 1, wherein defining the region includes adhering a contact mask onto the given surface.

13. The method of claim 1, further comprising attaching the heat-removal device and the semiconductor die to one or more carriers before preparing the first surface and the second surface.

14. The method of claim 1, wherein the thermal-interface material has approximately a uniform thickness in the region.

15. The method of claim 14, wherein the thickness is between 1 and 150 μm at atmospheric pressure.

16. The method of claim 1, wherein the thermal-interface material includes a gallium-indium-tin alloy.

17. The method of claim 16, wherein the gallium-indium-tin alloy includes between 55-75% gallium, 15-25% indium, and 5-20% tin.

18. The method of claim 1, wherein the mask confines the thermal-interface material to the region.

19. The method of claim 1, wherein the liquid metal has a bulk thermal conductivity between 7 and 100 W/mK.

20. The method of claim 1, wherein the liquid metal has a melting temperature below room temperature.

21. The method of claim 1, further comprising:
defining another region on another surface, which is the other of the first surface and the second surface; and
applying the thermal-interface material to the other region.

22. The method of claim 1, further comprising placing the heat-removal device and the semiconductor die in a containment box before spray-coating the thermal-interface material,
wherein the containment box includes a fluid recovery system for recycling excess thermal interface material.

23. A method for applying a thermal-interface material, comprising:
depositing a first layer on a heat-removal device and depositing a second layer having a surface on the first layer, wherein the first layer is substantially insoluble in a thermal-interface material and the second layer wets with the thermal-interface material;
depositing a third layer on a semiconductor die and depositing a fourth layer having another surface on the third layer, wherein the third layer is substantially insoluble in the thermal-interface material and the fourth layer wets with the thermal-interface material;
adhering a contact mask onto a given surface to define a region where the thermal-interface material is to be applied, wherein the contact mask exposes the region, wherein the given surface can be at least one of the surface and the other surface, and wherein the mask includes a layer of adhesive material sandwiched between layers of non-adhesive material; and
spray-coating the thermal-interface material to at least the region, wherein the thermal-interface material is a liquid metal over a range of operating temperatures of the semiconductor die.

* * * * *

UNITED STATES PATENT AND TRADEMARK OFFICE
CERTIFICATE OF CORRECTION

| | | |
|---|---|---|
| PATENT NO. | : 7,838,418 B2 | Page 1 of 1 |
| APPLICATION NO. | : 11/954158 | |
| DATED | : November 23, 2010 | |
| INVENTOR(S) | : Hillman et al. | |

It is certified that error appears in the above-identified patent and that said Letters Patent is hereby corrected as shown below:

In column 5, line 46, delete "sliver," and insert -- silver, --, therefor.

In column 5, line 52, delete "1,2, 3," and insert -- 1, 2, 3, --, therefor.

Signed and Sealed this
Twenty-second Day of November, 2011

David J. Kappos
*Director of the United States Patent and Trademark Office*